United States Patent
Fujise et al.

(10) Patent No.: US 10,192,754 B2
(45) Date of Patent: Jan. 29, 2019

(54) EPITAXIAL SILICON WAFER AND METHOD FOR PRODUCING THE EPITAXIAL SILICON WAFER

(71) Applicant: SUMCO CORPORATION, Tokyo (JP)

(72) Inventors: Jun Fujise, Tokyo (JP); Toshiaki Ono, Tokyo (JP)

(73) Assignee: SUMCO CORPORATION, Tokyo (JP)

(*) Notice: Subject to any disclaimer, the term of this patent is extended or adjusted under 35 U.S.C. 154(b) by 0 days.

(21) Appl. No.: 15/311,307

(22) PCT Filed: Apr. 21, 2015

(86) PCT No.: PCT/JP2015/002157
§ 371 (c)(1),
(2) Date: Nov. 15, 2016

(87) PCT Pub. No.: WO2016/006145
PCT Pub. Date: Jan. 14, 2016

(65) Prior Publication Data
US 2017/0076959 A1 Mar. 16, 2017

(30) Foreign Application Priority Data
Jul. 9, 2014 (JP) .................. 2014-141551

(51) Int. Cl.
H01L 21/322 (2006.01)
H01L 29/32 (2006.01)
(Continued)

(52) U.S. Cl.
CPC ...... *H01L 21/3221* (2013.01); *H01L 21/3225* (2013.01); *H01L 29/32* (2013.01);
(Continued)

(58) Field of Classification Search
CPC ....... C30B 29/06; C30B 15/203; C30B 15/00; C30B 33/00; C30B 33/02; C30B 35/007;
(Continued)

(56) References Cited

U.S. PATENT DOCUMENTS

| 5,994,761 A | 11/1999 | Falster et al. |
| 6,180,220 B1 | 1/2001 | Falster et al. |

(Continued)

FOREIGN PATENT DOCUMENTS

| JP | 2001-509319 A | 7/2001 |
| JP | 2010-087512 A | 4/2010 |

(Continued)

OTHER PUBLICATIONS

Search Report issued in WIPO Patent Application No. PCT/JP2015/002157, dated Jul. 28, 2015.

*Primary Examiner* — David Chen
(74) *Attorney, Agent, or Firm* — Greenblum & Bernstein, P.L.C.

(57) ABSTRACT

A method for producing an epitaxial silicon wafer, including a preliminary thermal treatment step of subjecting a silicon wafer to thermal treatment for increasing a density of oxygen precipitates, the silicon wafer being one that has an oxygen concentration in a range of $9 \times 10^{17}$ atoms/cm$^3$ to $16 \times 10^{17}$ atoms/cm$^3$, contains no dislocation cluster and no COP, and contains an oxygen precipitation suppression region, and an epitaxial layer forming step of forming an epitaxial layer on a surface of the silicon wafer after the preliminary thermal treatment step. The production method further includes a thermal treatment condition determining step of determining a thermal treatment condition in the preliminary thermal treatment step, based on a ratio of the oxygen precipitation suppression region of the silicon wafer before the preliminary thermal treatment step is carried out.

1 Claim, 3 Drawing Sheets

(51) Int. Cl.
  *C30B 15/20* (2006.01)
  *C30B 33/02* (2006.01)
  *C30B 15/00* (2006.01)
(52) U.S. Cl.
  CPC ............ *C30B 15/00* (2013.01); *C30B 15/203* (2013.01); *C30B 33/02* (2013.01); *H01L 21/322* (2013.01)
(58) Field of Classification Search
  CPC ........... H01L 21/3225; H01L 21/02658; H01L 21/3221; H01L 21/322
  USPC ................ 257/655, E21.321; 117/2, 13, 20; 438/471, 473
  See application file for complete search history.

(56) References Cited

U.S. PATENT DOCUMENTS

| | | | |
|---|---|---|---|
| 6,204,152 B1 | 3/2001 | Falster et al. | |
| 6,306,733 B1 | 10/2001 | Falster et al. | |
| 6,586,068 B1 | 7/2003 | Falster et al. | |
| 8,890,291 B2 | 11/2014 | Ono et al. | |
| 9,502,266 B2 | 11/2016 | Ono et al. | |
| 2002/0026893 A1 | 3/2002 | Falster et al. | |
| 2003/0196586 A1 | 10/2003 | Falster et al. | |
| 2010/0078767 A1 | 4/2010 | Park | |
| 2010/0290971 A1* | 11/2010 | Itou | C30B 15/00 423/348 |
| 2011/0227202 A1 | 9/2011 | Park | |
| 2013/0270681 A1 | 10/2013 | Park | |
| 2016/0247694 A1 | 8/2016 | Fujise et al. | |
| 2016/0377554 A1 | 12/2016 | Fujise et al. | |

FOREIGN PATENT DOCUMENTS

JP  2011-243923 A  12/2011
WO  2003/009365 A  1/2003

* cited by examiner

EPITAXIAL SILICON WAFER AND METHOD FOR PRODUCING THE EPITAXIAL SILICON WAFER

TECHNICAL FIELD

The present invention relates to an epitaxial silicon wafer and a method for producing the epitaxial silicon wafer, and more particularly relates to an epitaxial silicon wafer provided with a silicon wafer that contains no dislocation cluster and no COP (Crystal Originated Particle), and a method for producing the epitaxial silicon wafer.

BACKGROUND ART

Oxygen precipitates (BMD; Bulk Micro Defect) in a silicon wafer are useful to capture impurities in a semiconductor device process. The oxygen precipitates are formed in a growing stage of a silicon single crystal, which is a material for a wafer, for example. However, concerning an epitaxial silicon wafer, it is known that the wafer is subjected to a high temperature at a time of epitaxial growth treatment, whereby the oxygen precipitates inside the wafer disappear, and an impurities capturing ability (a gettering ability) is reduced. Consequently, it is desired to provide an epitaxial wafer excellent in impurities capturing ability.

A technique (a pre-annealing technique) has been known (refer to Patent Literature 1, for example) that performs thermal treatment of a wafer at a temperature of 600° C. or more before epitaxial growth treatment, in order to obtain such an epitaxial silicon wafer. By the thermal treatment, the oxygen precipitate density inside the water is increased in advance so that oxygen precipitates remain with a sufficient density after the epitaxial growth treatment, whereby the impurity capturing ability of the wafer after epitaxial growth is enhanced.

Meanwhile, in order to produce a semiconductor device with high quality, it is important to prevent a defect from being introduced into an epitaxial layer of an epitaxial silicon wafer to be a substrate. However, since reduction in a film thickness of the epitaxial layer advances, if a defect is present in a surface layer portion of a silicon wafer on which the epitaxial layer is formed, an epitaxial defect such as a stacking fault due to the defect is likely to be generated in the epitaxial layer.

The defects causing epitaxial defects out of the defects included in a silicon wafer include a dislocation cluster and COP. A dislocation cluster is an aggregate of interstitial silicon atoms that are excessively taken interstitially, and is a defect (a dislocation loop) of a large size of approximately 10 μm, for example. A COP is an aggregate (a vacancy aggregate hollow defect) of vacancies where atoms that should compose a crystal lattice are lost. In order to prevent generation of an epitaxial defect, use of a wafer where neither a dislocation cluster nor COP is present is useful.

As a region where no COP and no dislocation cluster are present in a silicon wafer, there is an oxygen precipitation promotion region (hereinafter, also referred to as "Pv region") and an oxygen precipitation suppression region (hereinafter, also referred to as "Pi region"). The Pv region is a defect-free region where a vacancy type point defect is dominant, and the Pi region is a defect-free region where an interstitial silicon type point defect is dominant.

When a pulling velocity of a silicon single crystal is V, and a temperature gradient in a growth direction in the single crystal directly after pulling is G, whether a COP appears, a dislocation cluster appears, or neither of them appears depends on V/G. When distances from the center axis of the silicon single crystal are the same, the region including a dislocation cluster, a Pi region, a Pv region and a region including a COP appear sequentially as V/G becomes larger. When a plurality of kinds of regions coexist in a wafer, the respective regions are distributed concentrically with respect to the center of the wafer.

A silicon wafer composed of a region where no COP and no dislocation cluster are present is useful as a substrate wafer for epitaxial growth. However, it is very difficult to grow a silicon single crystal so that an entire region of the wafer is composed of a crystal region of the same kind (for example, only one of the Pv region and the Pi region). This is because a control process margin width, more specifically, a range of allowable V/G is narrow. If it is allowed to grow a single crystal in a range of a growth condition in which both of the Pv region and the Pi region are obtained, the control process margin width increases, and it is possible to produce a crystal that contains no dislocation cluster and no COP stably.

CITATION LIST

Patent Literature

Patent Literature 1: WO 2003/009365

SUMMARY OF INVENTION

Technical Problem

However, when the wafer is heated, an oxygen readily precipitates in the Pv region, whereas an oxygen hardly precipitates in the Pi region. In the wafer where the Pv region and the Pi region coexist, these regions are present in different regions with respect to a radial direction of the wafer. Consequently, when such a wafer is used as a substrate for epitaxial growth, the oxygen precipitate density varies significantly in the wafer radial direction, and when the wafer is heated in epitaxial growth treatment, there arises the problem that a gettering ability varies with respect to the radial direction in the obtained epitaxial silicon wafer. In Patent Literature 1, the wafer where the Pv region and the Pi region coexist is not taken into consideration.

An object of the present invention, which has been made in the light of the above described problem, is to provide a wafer that is an epitaxial silicon wafer and is excellent in gettering ability throughout an entire surface of the wafer, and a method for producing the wafer.

Solution to Problem

A gist of the present invention is an epitaxial silicon wafer described in (I) as follows, and a method for producing the epitaxial silicon wafer in (II) as follows.
(I) An epitaxial silicon wafer having an epitaxial layer on a surface of a silicon wafer that contains no dislocation cluster and no COP,
  wherein when an oxygen precipitate density is evaluated by subjecting the epitaxial silicon wafer to oxygen precipitate evaluation thermal treatment in which the epitaxial silicon wafer is thermally treated at 1000° C. for 16 hours, a density of oxygen precipitates in a central portion in a thickness direction of the silicon wafer is $5\times10^4/cm^2$ or more throughout an entire region in a radial direction of the silicon wafer.

(II) A method for producing an epitaxial silicon wafer, including
a preliminary thermal treatment step of performing thermal treatment for increasing a density of oxygen precipitates, for a silicon wafer that has an oxygen concentration in a range of $9 \times 10^{17}$ atoms/cm$^3$ to $16 \times 10^{17}$ atoms/cm$^3$, contains no dislocation cluster and no COP, and contains an oxygen precipitation suppression region, and
an epitaxial layer forming step of forming an epitaxial layer on a surface of the silicon wafer, after the preliminary thermal treatment step,
the production method further including a thermal treatment condition determining step of determining a thermal treatment condition in the preliminary thermal treatment step, based on a ratio of the oxygen precipitation suppression region of the silicon wafer before the preliminary thermal treatment step is carried out.

In the method for producing an epitaxial silicon wafer of the aforementioned (II), in the thermal treatment condition determining step, the thermal treatment condition is preferably determined so as to satisfy any one of the following relational expressions (1) to (3):

In a case of $9 \times 10^{17}$ atoms/cm$^3 \leq \text{Co} < 11.5 \times 10^{17}$ atoms/cm$^3$:

$$(\text{Co} \times (100-X)/5.3 \times 10^{51})^{(-1/11.29)} < T \leq 800 \tag{1}$$

In a case of $11.5 \times 10^{17}$ atoms/cm$^3 \leq \text{Co} < 13.5 \times 10^{17}$ atoms/cm$^3$:

$$(\text{Co} \times (100-X)/5.3 \times 10^{51})^{(-1/11.29)} < T \leq 900 - (13.5 \times 10^{17} - \text{Co}) \times 5 \times 10^{-16} \tag{2}$$

In a case of $13.5 \times 10^{17}$ atoms/cm$^3 \leq \text{Co} \leq 16 \times 10^{17}$ atoms/cm$^3$:

$$(\text{Co} \times (100-X)/5.3 \times 10^{51})^{(-1/11.29)} < T \leq 900 \tag{3}$$

where a temperature (° C.) of the thermal treatment in the preliminary thermal treatment step is T, a ratio (%) of a width of the oxygen precipitation suppression region in a radial direction of the silicon wafer to a radius of the silicon wafer is X, and an oxygen concentration (atoms/cm$^3$) of the silicon wafer is Co.

Advantageous Effects of Invention

The epitaxial silicon wafer of the present invention can have the oxygen precipitate density of $5 \times 10^4$/cm$^2$ or more throughout the entire region in the radial direction in the central portion in the thickness direction. Such an epitaxial silicon wafer having the oxygen precipitate density is excellent in gettering ability throughout the entire surface of the wafer.

Further, the silicon wafer that is used in the production method of the present invention contains no dislocation cluster and no COP, and therefore, an epitaxial defect such as a stacking fault with a dislocation cluster or a COP as a starting point is prevented or restrained from being introduced into the epitaxial layer.

In the method for producing the epitaxial silicon wafer of the present invention, the condition of the thermal treatment (the thermal treatment for increasing the density of the oxygen precipitates) in the preliminary thermal treatment step is determined based on the ratio of the oxygen precipitation suppression region. The ratio of the oxygen precipitation suppression region serves as an indicator of difficulty of occurrence and growth of the oxygen precipitates as the entire wafer. Accordingly, by determining the condition of the thermal treatment in the preliminary thermal treatment step based on the ratio of the oxygen precipitation suppression region, the epitaxial silicon wafer with a high oxygen precipitate density throughout the entire region in the radial direction can be obtained. Such an epitaxial silicon wafer causes oxygen precipitates to grow by thermal treatment in a proper condition, and can have an excellent gettering ability. According to the production method of the present invention, the epitaxial silicon wafer of the present invention can be produced.

DESCRIPTION OF EMBODIMENTS

Figure 1:
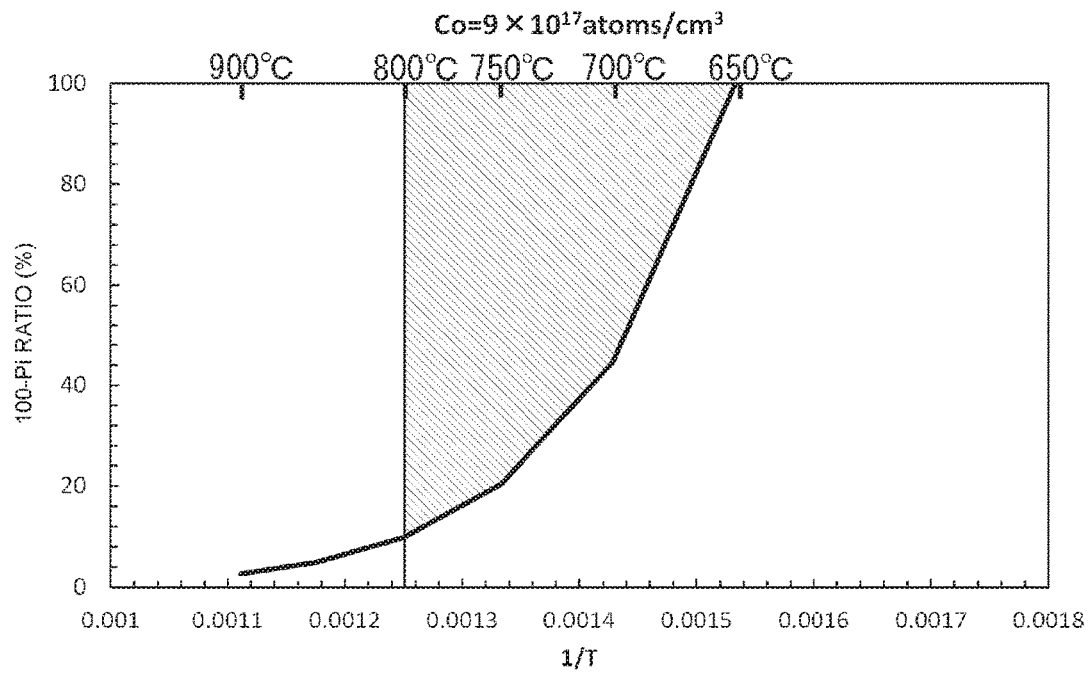
FIG. 1 is a diagram showing a characteristic of a wafer with an oxygen concentration of $9 \times 10^{17}$ atoms/cm$^3$.

Presence or absence of a COP can be determined by an evaluation method as follows. A silicon single crystal is grown by the Czochralski (CZ) method, and from the single crystal ingot, a silicon wafer is cut out. The silicon wafer cut out from the single crystal ingot is cleaned by SC-1 (a mixed solution obtained by mixing ammonia water, a hydrogen peroxide and ultrapure water at 1:1:15 (volume ratio)). The cleaned silicon wafer surface is observed and evaluated by using Surfscan SP-2 manufactured by KLA-Tenchor corporation as a surface defect inspection device, and light point defects (LPD: Light Point Defect) assumed to be pits (recessed portions) formed on the surface are determined. At this time, an observation mode is set at an Oblique mode (an oblique incident mode), and assumption of whether or not the light point defects are pits is made based on a detection size ratio of a Wide Narrow channel. Evaluation of whether a COP or not is performed for the LPD determined in this way by using an atomic force microscope (AFM: Atomic Force Microscope). At this time, when the shape of the pit forms a part of an octahedron, the pit is determined as a COP. By the observation and evaluation, presence or absence of a COP can be determined. Accordingly, whether or not a silicon wafer is a silicon wafer "containing no COP" can be determined by the above described evaluation method.

The silicon wafer "containing no dislocation cluster" means that the silicon wafer does not contain a defect that becomes evident by etching such as secco etching or Cu decoration and can be recognized at a visual level.

The silicon water that contains no COP or no dislocation cluster includes an oxygen precipitation suppression region (Pi region) and an oxygen precipitation promotion region (Pv region). Of these regions, the Pi region refers to a crystal region in which a density of oxygen precipitates observed in a center of a thickness direction by an optical microscope is less than $1 \times 10^4$/cm$^2$ when thermal treatment that heats the silicon wafer at 1000° C. for 16 hours under oxidative gas atmosphere (hereinafter referred to as "oxygen precipitate evaluation thermal treatment") is performed, thereafter, the silicon wafer is cleaved so that a section along the thickness direction becomes visible, and a surface layer portion of the section is removed by a thickness of 2 μm by Wright etching (with use of a chromic acid).

The Pv region refers to a crystal region in which the density of oxygen precipitates is $1 \times 10^4/cm^2$ or more when observation similar to the observation at the time of evaluating whether or not the crystal region is a Pi region in accordance with the definition of the above described Pi region is performed. An OSF (Oxidation induced Stacking Fault) region (a region containing plate-like oxygen precipitates (OSF nuclei) that become evident as OSF at 1000 to 1200° C. in an as-grown state) is also comprehended in the Pv region as long as the requirement is satisfied.

As described above, the epitaxial silicon wafer of the present invention has an epitaxial layer on the surface of a silicon wafer that contains no dislocation cluster and no COP. When an oxygen precipitate density is evaluated by subjecting the epitaxial silicon wafer to the oxygen precipitate evaluation thermal treatment at 1000° C. for 16 hours, a density of oxygen precipitates in a central portion in a thickness direction of the silicon wafer is $5 \times 10^4/cm^2$ or more throughout an entire region in a radial direction of the silicon wafer.

The epitaxial silicon wafer of the present invention can have the oxygen precipitate density of $5 \times 10^4/cm^2$ or more throughout the entire region in the radial direction in the central portion in the thickness direction. Such an epitaxial silicon wafer having the oxygen precipitates with the density is excellent in gettering ability throughout the entire surface.

As described above, the method for producing an epitaxial silicon wafer of the present invention includes a preliminary thermal treatment step of performing thermal treatment for increasing a density of oxygen precipitates, for a silicon wafer that has an oxygen concentration in a range of $9 \times 10^{17}$ atoms/cm$^3$ to $16 \times 10^{17}$ atoms/cm$^3$, contains no dislocation cluster and no COP, and contains an oxygen precipitation suppression region, and an epitaxial layer forming step of forming an epitaxial layer on a surface of the silicon wafer after the preliminary thermal treatment step. The production method further includes a thermal treatment condition determining step of determining a thermal treatment condition in the preliminary thermal treatment step, based on a ratio of the oxygen precipitation suppression region of the silicon wafer before the preliminary thermal treatment step is carried out.

As for the silicon wafer, "oxygen concentration" is by ASTM F121-1979.

The silicon wafer for which thermal treatment is performed in the preliminary thermal treatment step may be a silicon wafer in which the oxygen precipitation suppression region and the oxygen precipitation promotion region coexist. Consequently, at the time of production of the silicon single crystal from which the silicon wafer should be cut out, the control process margin width can be made large. The silicon wafer for which thermal treatment is performed in the preliminary thermal treatment step may be formed of only the oxygen precipitation suppression region.

When the oxygen concentration of the silicon wafer before the preliminary thermal treatment step is carried out is $9 \times 10^{17}$ atoms/cm$^3$ or more, the density of the oxygen precipitates can be increased by the preliminary thermal treatment not only in the oxygen precipitation promotion region but also in the oxygen precipitation suppression region. When the oxygen concentration of the silicon wafer before the preliminary thermal treatment step is carried out is higher than $16 \times 10^{17}$ atoms/cm$^3$, oxygen precipitation becomes excessive, and the oxygen precipitates are formed on the wafer surface side where the epitaxial layer is formed, so that there arises the fear of occurrence of epitaxial defects due to the oxygen precipitates.

In the silicon wafer for which thermal treatment in the preliminary thermal treatment step is performed in accordance with the requirements of the present invention, oxygen precipitates do not disappear, even when the silicon wafer is heated in the epitaxial layer forming step, and by heating the silicon wafer in the proper condition after the epitaxial layer forming step is carried out, the oxygen precipitates are formed with the density of $5 \times 10^4/cm^2$ or more throughout the entire region in the radial direction in the central portion in the thickness direction of the wafer. Consequently, according to the method of the present invention, the epitaxial silicon wafer excellent in gettering ability throughout the entire surface can be produced.

A time period (a time period in which a predetermined thermal treatment temperature is kept; hereinafter referred to as "a preliminary thermal treatment keeping time period") of the thermal treatment in the preliminary thermal treatment step may be set in a range of substantially 0.5 to 16 hours, in accordance with the oxygen precipitate density which is a target. The reason why the time period in this range is preferable as the preliminary thermal treatment keeping time period is as follows. When the preliminary thermal treatment keeping time period is less than 0.5 hours, growth of the oxygen precipitates in the oxygen precipitation suppression region is insufficient, and the oxygen precipitates disappear by the high-temperature thermal treatment in the epitaxial layer forming step. Further, when the preliminary thermal treatment keeping time period reaches more than 16 hours, oxygen precipitates become excessive, and epitaxial defects (stacking faults) with the oxygen precipitates present on the wafer surface as starting points easily occur.

As the epitaxial layer formed in the epitaxial layer forming step, a silicon epitaxial layer is cited. The method for forming the epitaxial layer is not specially limited, and the epitaxial layer can be formed in an ordinary condition by a CVD method or the like, for example. For example, by introducing a source gas such as dichlorosilane and trichlorosilane into a chamber where the silicon wafer is housed, with hydrogen gas as a carrier gas, the silicon epitaxial layer can be grown on the silicon wafer by the CVD method at a temperature (a growth temperature) in a range of substantially 1000 to 1200° C. The growth temperature differs in accordance with the kind of the source gas to be used. The thickness of the epitaxial layer is preferably within a range of 0.5 to 15 μm.

In the thermal treatment condition determining step, the thermal treatment condition in the preliminary thermal treatment step is preferably determined so as to satisfy any one of the following relational expressions (1) to (3).

In a case of $9 \times 10^{17}$ atoms/cm$^3 \leq Co < 11.5 \times 10^{17}$ atoms/cm$^3$:

$$(Co \times (100-X)/5.3 \times 10^{51})^{(-1/11.29)} < T \leq 800 \qquad (1)$$

In a case of $11.5 \times 10^{17}$ atoms/cm$^3 \leq Co < 13.5 \times 10^{17}$ atoms/cm$^3$:

$$(Co \times (100-X)/5.3 \times 10^{51})^{(-1/11.29)} < T \leq 900 - (13.5 \times 10^{17} - Co) \times 5 \times 10^{-16} \qquad (2)$$

In a case of $13.5 \times 10^{17}$ atoms/cm$^3 \leq Co \leq 16 \times 10^{17}$ atoms/cm$^3$:

$$(Co \times (100-X)/5.3 \times 10^{51})^{(-1/11.29)} < T \leq 900 \qquad (3)$$

In the relational expressions (1) to (3) as described above, meanings of T, X and Co are as follows.

T: a temperature (° C.) of the thermal treatment in the preliminary thermal treatment step X: a ratio (%) of a width of the oxygen precipitation suppression region in a radial direction of the silicon wafer to a radius of the silicon wafer Co: an oxygen concentration (atoms/cm$^3$) of the silicon wafer Example In order to confirm an effect of the present invention, the tests and evaluations as follows were performed.

A plurality of silicon single crystals with diameters of approximately 300 mm that contain no COP and no dislocation cluster were produced by the Czochralski method, and silicon wafers were cut out from respective sites of these silicon single crystals. On growing the silicon single crystals, growth conditions were changed so that ratios of oxygen concentrations and oxygen precipitation suppression regions differ variously.

Table 1 shows the ratios of the oxygen concentrations and the oxygen precipitation suppression regions of the obtained silicon wafers. The ratio of the oxygen precipitation suppression region is shown by a ratio (%; hereinafter referred to as "a Pi ratio") of a width of the oxygen precipitation suppression region in the radial direction of the silicon wafer to a radius of the silicon wafer. In the silicon wafers obtained in this way, there were five levels of oxygen concentrations, four levels of Pi ratios, and 20 levels of combinations of the oxygen concentrations and Pi ratios. Each of the silicon wafers contained an oxygen precipitation suppression region (a Pi ratio is not zero).

TABLE 1

| OXYGEN CONCENTRATION ($\times 10^{17}$ atoms/cm$^3$) | 9, 11.5, 12.5, 13.5, 16 |
|---|---|
| Pi REGION WIDTH RATIO (%) | 10, 30, 50, 70 |
| TEMPERATURE OF THERMAL TREATMENT (C. °) | 650, 700, 750, 800, 900 |

Thermal treatment (preliminary thermal treatment) was performed for these silicon wafers for 16 hours with the temperatures being changed. The temperatures of the thermal treatment are shown in Table 1. Thereafter, the respective silicon wafers were transferred into a single-wafer epitaxial growth apparatus (made by Applied Materials, Inc.), hydrogen bake treatment for 30 seconds was performed at a temperature of 1120° C. in the apparatus, and thereafter, silicon epitaxial layers of a thickness of 4 μm were grown on the silicon wafers by a CVD method at 1150° C. with hydrogen as carrier gas and a trichlorosilane as source gas, whereby epitaxial silicon wafers were obtained.

Subsequently, oxygen precipitate evaluation thermal treatment for 16 hours was performed at 1000° C. for these epitaxial silicon wafers. Thereafter, these epitaxial silicon wafers were cleaved at surfaces including centers of the wafers in the thickness directions of the wafers, the cleaved surfaces were etched by 2 μm with a light etching solution, and densities of pits that became evident on the etched surfaces were measured by an optical microscope with a 500-fold magnification, and were determined as oxygen precipitate densities. Measurement of the oxygen precipitate densities was performed at a plurality of sites along the radial directions of the wafers.

Figure 2:
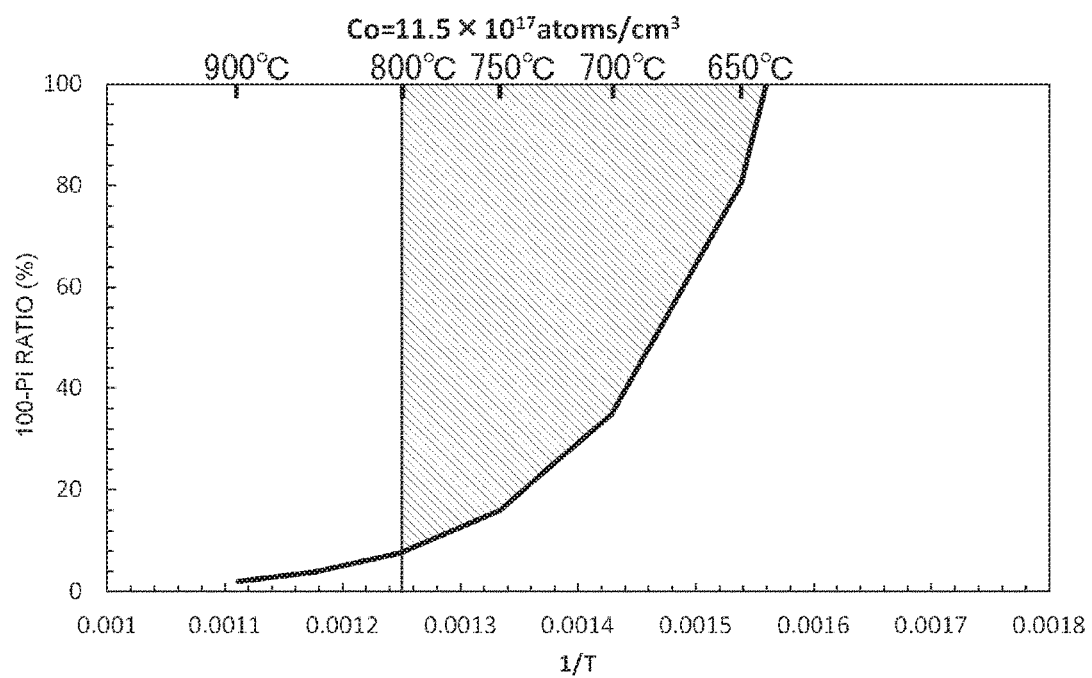
FIG. 2 is a diagram showing a characteristic of a wafer with an oxygen concentration of $11.5 \times 10^{17}$ atoms/cm$^3$.
Figure 3:
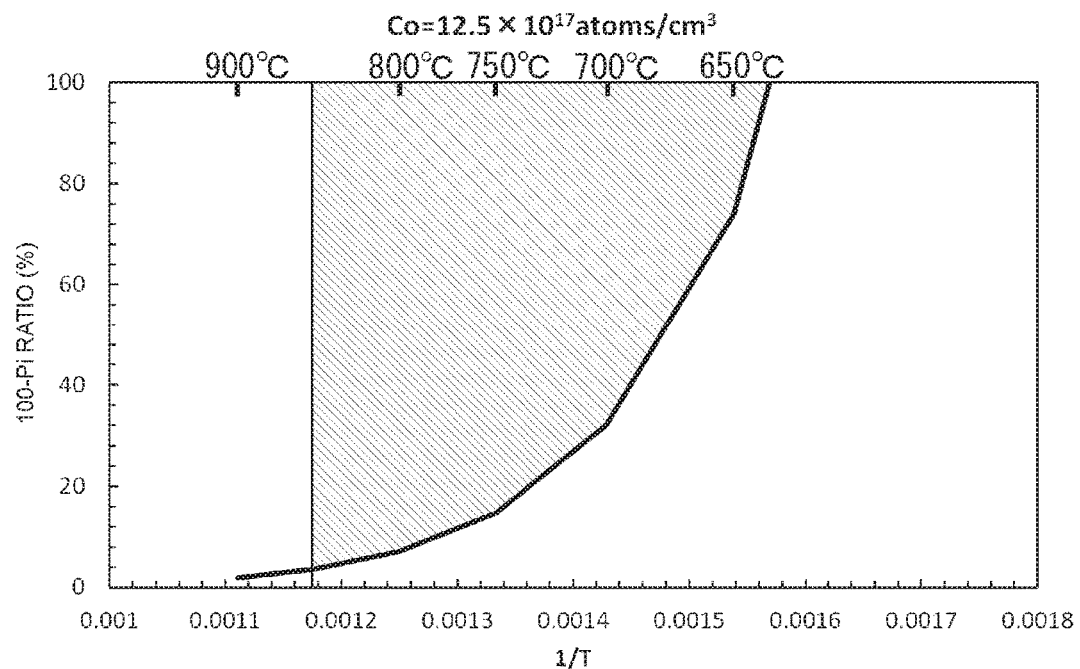
FIG. 3 is a diagram showing a characteristic of a wafer with an oxygen concentration of $12.5 \times 10^{17}$ atoms/cm$^3$.
Figure 4:
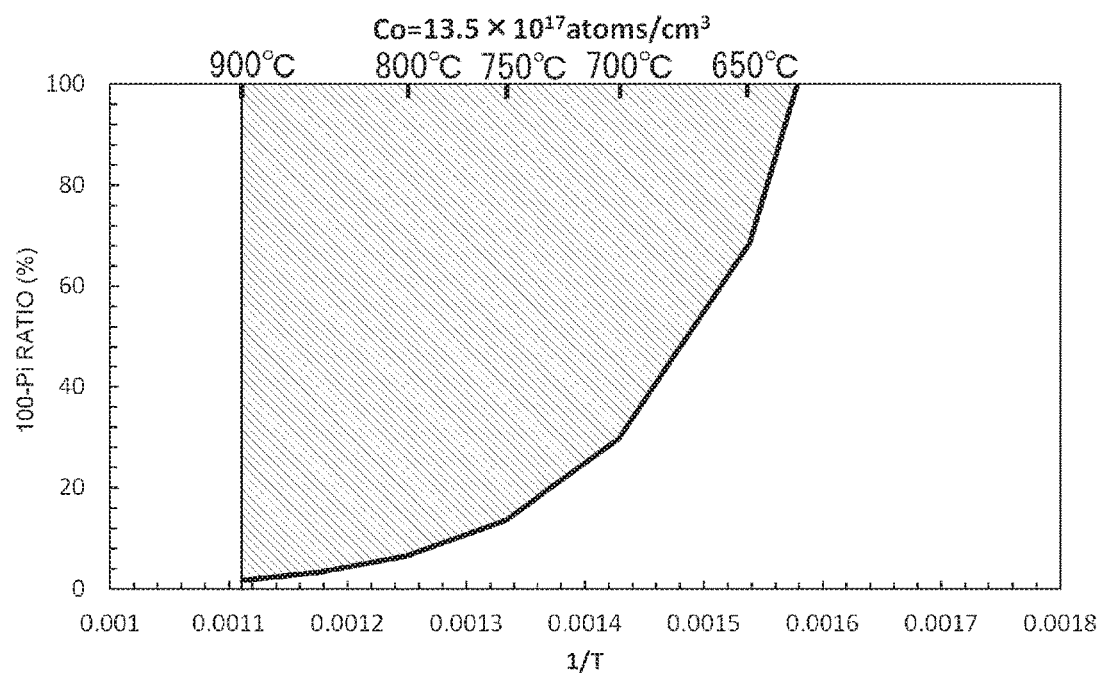
FIG. 4 is a diagram showing a characteristic of a wafer with an oxygen concentration of $13.5 \times 10^{17}$ atoms/cm$^3$.
Figure 5:
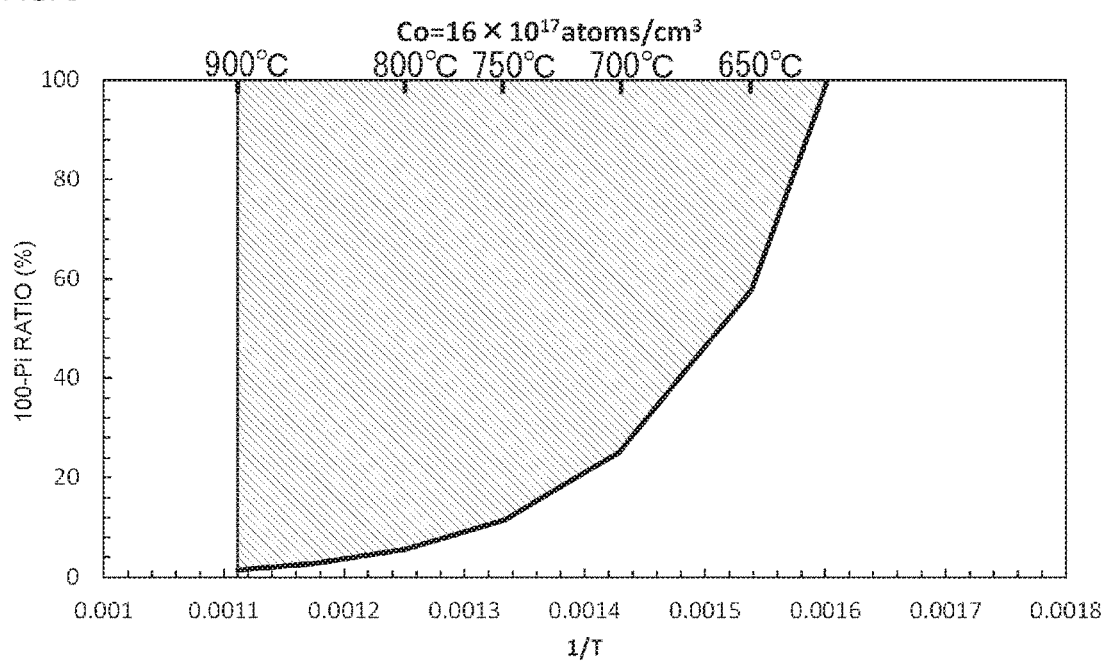
FIG. 5 is a diagram showing a characteristic of a wafer with an oxygen concentration of $16 \times 10^{17}$ atoms/cm$^3$.

FIGS. 1 to 5 illustrate characteristics of the wafers according to the respective oxygen concentrations. Each of the drawings illustrates a relation between an inverse number of the temperature T (i.e. 1/T (/° C.)) of the preliminary thermal treatment and a 100-Pi ratio, and whether or not the oxygen precipitate density after the oxygen precipitate evaluation thermal treatment is 5×10$^4$/cm$^2$ or more throughout the wafer entire surface. In each of FIGS. 1 to 5, 1/T is plotted on a horizontal axis (values of T (a numeric value assigned with "° C.") are shown in addition), the 100-Pi ratio, that is, the ratio of the region which is not a Pi region is plotted in a vertical axis. Further, in each of FIGS. 1 to 5, hatching is applied to the condition region where the oxygen precipitate density is 5×10$^4$/cm$^2$ or more throughout the entire surface of the wafer.

In each of the drawings, the condition region (hereinafter, referred to as "a high BMD concentration condition region") where the oxygen precipitate density is 5×10$^4$/cm$^2$ or more throughout the entire surface of the wafer is at a high temperature side from a curve sloping from right to left (a left side in each of the drawings), and is at a low temperature side (a right side in each of the drawings) from a straight line perpendicular to the horizontal axis. That is, at least parts of these lines form boundaries between the high BMD concentration condition region and the other regions.

A temperature range in which the oxygen precipitate density after the oxygen precipitate evaluation thermal treatment is 5×10$^4$/cm$^2$ or more throughout the entire surface of the wafer with the temperature T (° C.) of the preliminary thermal treatment is as follows. In the following expression, X represents the Pi ratio.

When the oxygen concentration Co of the wafer is 9×10$^{17}$ atoms/cm$^3$ or more, and is less than 11.5×10$^{17}$ atoms/cm$^3$ (refer to FIG. 1), the temperature range is $$(Co \times (100-X)/5.3 \times 10^{51})^{(-1/11.29)} < T \leq 800 \quad (1).$$

When the oxygen concentration Co of the water is 11.5×10$^{17}$ atoms/cm$^3$ or more, and is less than 13.5×10$^{17}$ atoms/cm$^3$ (refer to FIG. 2 and FIG. 3), the temperature range is $$(Co \times (100-X)/5.3 \times 10^{51})^{(-1/11.29)} < T \leq 900 - (13.5 \times 10^{17} - Co) \times 5 \times 10^{-16} \quad (2).$$

When the oxygen concentration Co of the wafer is 13.5×10$^{17}$ atoms/cm$^3$ or more, and is 16×10$^{17}$ atoms/cm$^3$ or less (refer to FIG. 4 and FIG. 5), the temperature range is $$(Co \times (100-X)/5.3 \times 10^{51})^{(-1/11.29)} < T \leq 900 \quad (3).$$

As above, it has been found out that the temperature T of the thermal treatment before epitaxial layer formation is determined in accordance with any expression of (1) to (3) described above according to the oxygen concentration Co of the wafer and the Pi ratio X, whereby the epitaxial silicon wafer in which the oxygen precipitate density after oxygen precipitate evaluation thermal treatment is 5×10$^4$/cm$^2$ or more can be produced throughout the entire surface of the wafer. Such an epitaxial silicon wafer has a high gettering ability.

Further, with respect to the epitaxial silicon wafers that were produced at the respective levels shown in Table 1, the densities of the LPD Observed on the surface of the epitaxial layer were measured. More specifically, with respect to the epitaxial layer surfaces of the respective epitaxial silicon wafers, measurement of LPD was performed in a Normal mode by using Surfscan SP1 made by KLA-Tencor corporation as an LPD evaluation device, and defects that were counted as LPD-N out of defects counted as LPDs of 90 nm or more were detected as epitaxial defects. As a result, it has been confirmed that the number of epitaxial defects of each of the epitaxial silicon wafers is 10 or less per wafer, and the number of epitaxial defects is small.

The invention claimed is:

1. A method for producing an epitaxial silicon wafer, comprising:
    subjecting a silicon wafer to preliminary thermal treatment for increasing a density of oxygen precipitates, the silicon wafer being one that has an oxygen concentration in a range of $9 \times 10^{17}$ atoms/cm$^3$ to $16 \times 10^{17}$ atoms/cm$^3$, contains no dislocation cluster and no COP (Crystal Originated Particle), and contains an oxygen precipitation suppression region; and
    forming an epitaxial layer on a surface of the silicon wafer after the preliminary thermal treatment,
    the method further comprising determining a thermal treatment condition for the preliminary thermal treatment based on a ratio (%) of a width of the oxygen precipitation suppression region in a radial direction of the silicon wafer to a maximum radius of the silicon wafer before the preliminary thermal treatment is carried out;
    wherein the preliminary thermal treatment condition is determined so as to satisfy any one of the following relational expressions (1) to (3):
    in a case of $9 \times 10^{17}$ atoms/cm$^3 \leq$ Co $< 11.5 \times 10^{17}$ atoms/cm$^3$:
    $$(Co \times (100-X)/5.3 \times 10^{51})^{(-1/11.29)} < T \leq 800 \qquad (1),$$
    in a case of $11.5 \times 10^{17}$ atoms/cm$^3 \leq$ Co $< 13.5 \times 10^{17}$ atoms/cm$^3$:
    $$(Co \times (100-X)/5.3 \times 10^{51})^{(-1/11.29)} < T \leq 900 - (13.5 \times 10^{17} - Co) \times 5 \times 10^{-16} \qquad (2),$$
    and
    in a case of $13.5 \times 10^{17}$ atoms/cm$^3 \leq$ Co $\leq 16 \times 10^{17}$ atoms/cm$^3$:
    $$(Co \times (100-X)/5.3 \times 10^{51})^{(-1/11.29)} < T \leq 900 \qquad (3)$$
    where:
        a temperature (° C.) of the preliminary thermal treatment is T,
        the ratio (%) of the width of the oxygen precipitation suppression region in the radial direction of the silicon wafer to the maximum radius of the silicon wafer is X, and
        the oxygen concentration (atoms/cm$^3$) of the silicon wafer is Co.

* * * * *